United States Patent [19]

Madan

[11] Patent Number: 5,114,879
[45] Date of Patent: May 19, 1992

[54] METHOD OF FORMING A MICROELECTRONIC CONTACT

[75] Inventor: Sudhir K. Madan, Dallas, Tex.

[73] Assignee: Texas Instruments Incorporated, Dallas, Tex.

[21] Appl. No.: 620,961

[22] Filed: Nov. 30, 1990

[51] Int. Cl.⁵ .......................................... H01L 21/283
[52] U.S. Cl. ..................................... 437/195; 437/50; 437/59; 437/203; 437/978; 437/194; 437/43
[58] Field of Search ............... 437/192, 190, 200, 245, 437/52, 50, 51, 43, 195, 187, 59, 203, 978, 191; 357/23.6, 68; 148/DIG. 20

[56] References Cited

U.S. PATENT DOCUMENTS

| | | | |
|---|---|---|---|
| 4,374,700 | 2/1983 | Scott et al. | 437/192 |
| 4,960,729 | 10/1990 | Orbach et al. | 437/195 |
| 4,963,511 | 10/1990 | Smith | 437/187 |
| 4,966,864 | 10/1990 | Pfiester | 437/191 |
| 4,980,309 | 12/1990 | Mitchell et al. | 437/52 |
| 4,999,318 | 3/1991 | Takahumi et al. | 437/194 |

*Primary Examiner*—Brian E. Hearn
*Assistant Examiner*—T. N. Quach
*Attorney, Agent, or Firm*—Richard A. Stoltz; Stanton C. Braden; Richard L. Donaldson

[57] ABSTRACT

A method of forming an integrated-circuit device (10) which provides increased packing of unrelated conductors such as first gate (14) and second gate (16). Strap (20) electrically connects conductor contact area (28) to moat contact area (30) and yet also overlies and overlaps gate (16) above the overlap area (27) without any danger of shorting first gate (14) to second gate (16). According to the invention, the possibility of shorting strap (20) to second gate (16) and hence first gate (14) to second gate (16), is eliminated in the processing sequence wherein second insulating layer (24) is patterned to expose conductor contact area (28) at a prior step in the processing sequence. Subsequently, a third insulating layer (26) is formed to re-cover conductor contact area (28), yet the thickness of third insulating layer (26) is substantially less than the combination of the thickness of third insulating layer (26) and second insulating layer (24). Hence the etching requirements to re-expose conductor contact area (28), when moat contact area (30) is also exposed, is diminished. Hence the etch to expose conductor contact area (28) and moat contact area (30) does not run the risk of exposing gate (16) at overlap area (27), since the insulation over overlap area (27) is substantially thicker than third insulating layer (26) as noted above. According to the invention, strap (20) is formed to overlie second gate (16) so that second gate (16) may be laterally disposed immediately adjacent moat contact area (30).

12 Claims, 8 Drawing Sheets

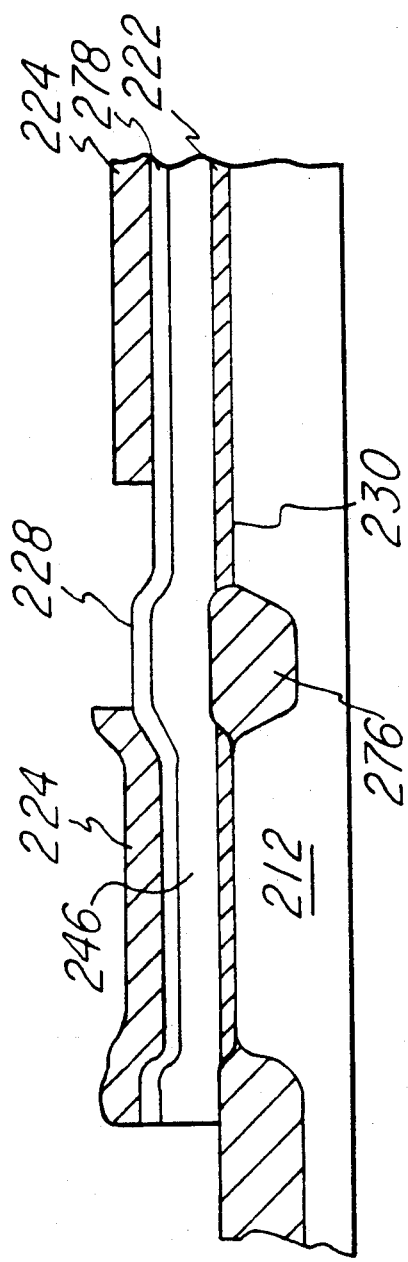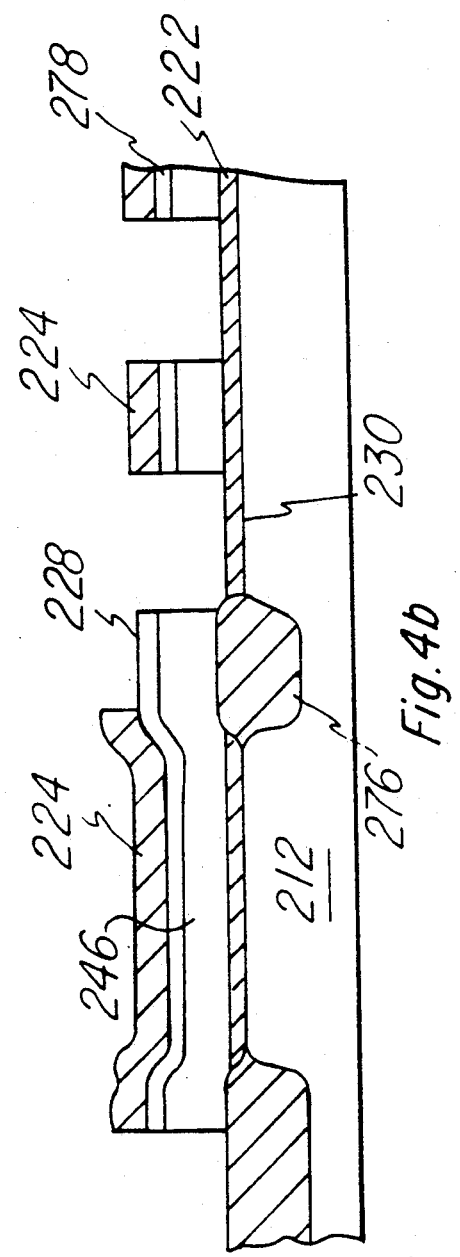

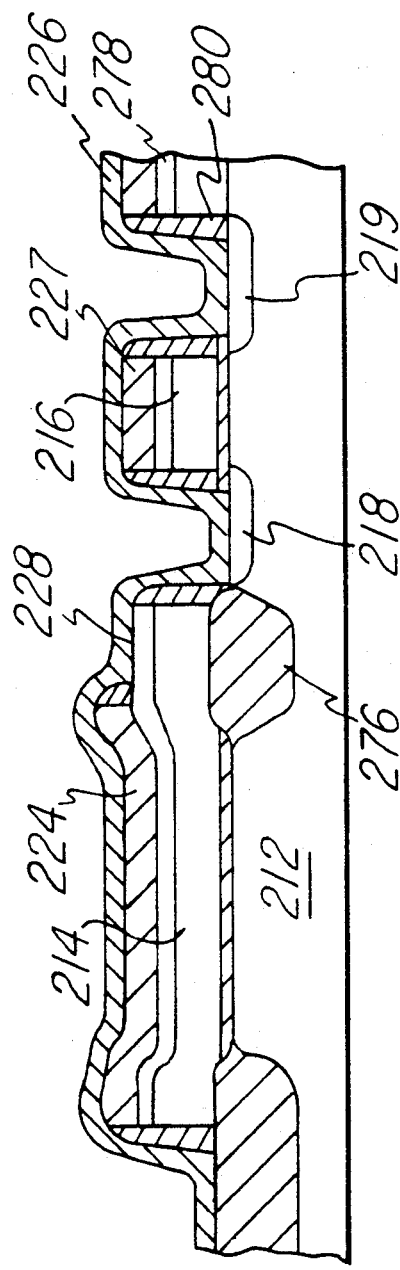
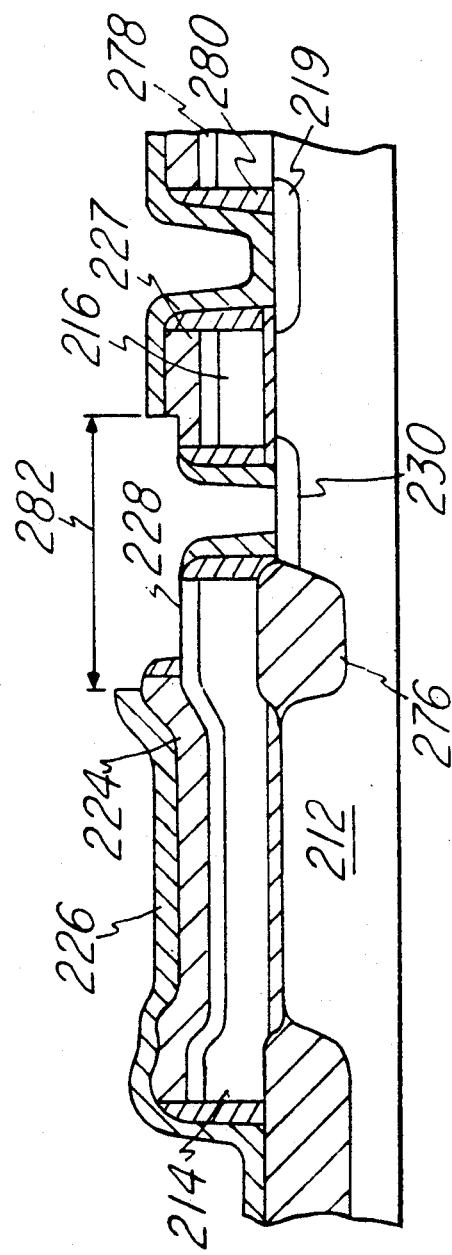
Fig. 4c
Fig. 4d

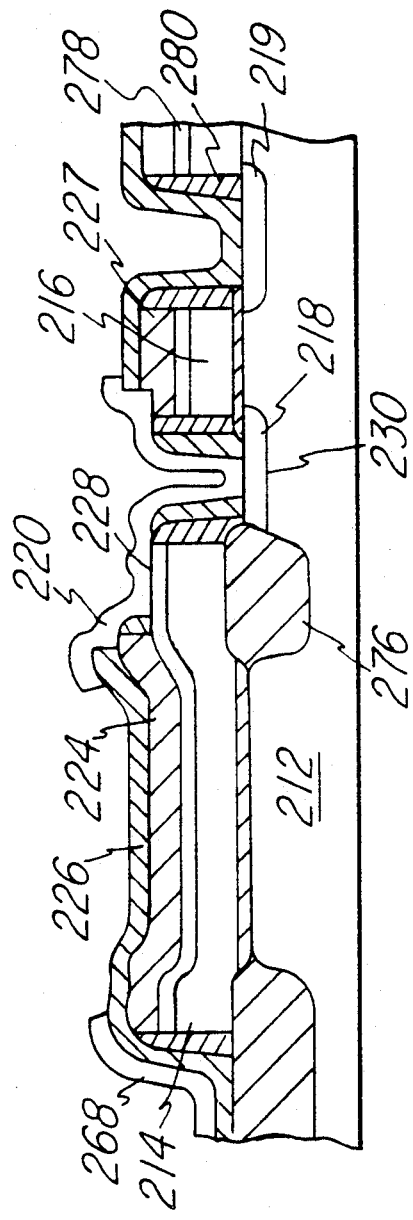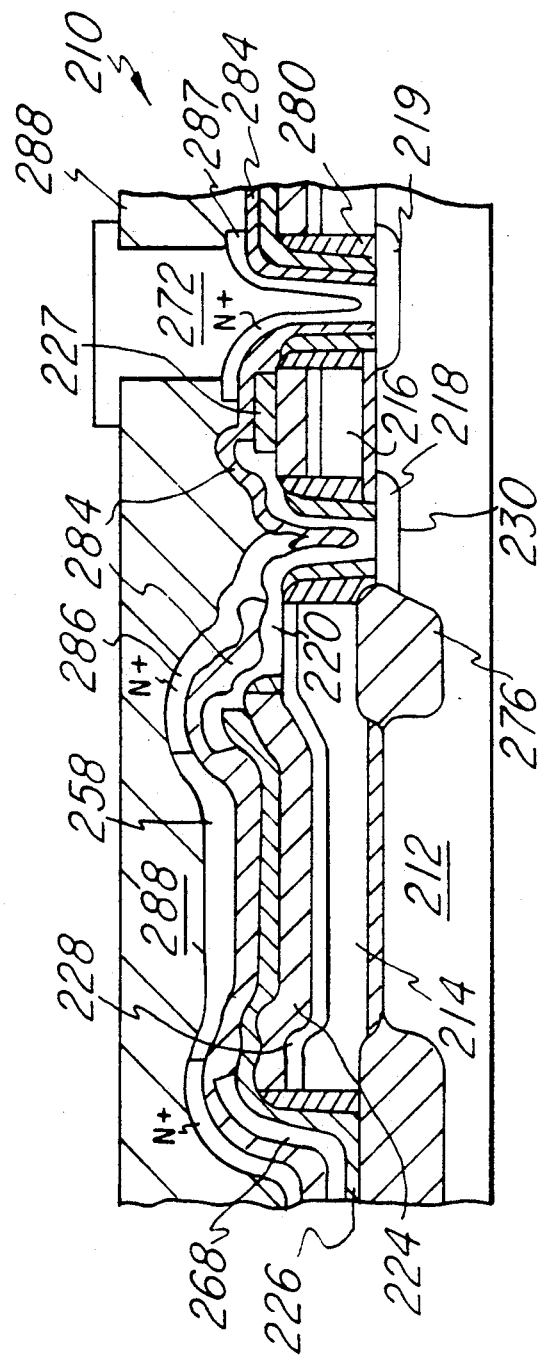

5,114,879

1

METHOD OF FORMING A MICROELECTRONIC CONTACT

BACKGROUND OF THE INVENTION

1. Field of the Invention

This invention relates to microelectronic devices incorporating conductive straps or contacts. More particularly, it is concerned with the method and structure for forming a conductive strap or the like.

2. Description of the Prior Art

As the dimensions of microelectronic devices decrease, one important concern is the upper surface area of the circuit. In particular, it is important that the surface area of an integrated circuit be condensed into as small a region as possible so as to save such surface area or so-called "real estate." One problem with condensing various devices into smaller and smaller areas is that as the scaling increases, it is necessary that the processing steps satisfy the requirements for each device in a localized area.

For example, in the fabrication of an SRAM cell including a conductive layer such as a gate, it is often necessary to remove an insulating layer, such as an oxide over the gate in order to form a strap (local interconnect) or the like between the gate and an active region, such as a moat region. In the course of removing the insulating layer, typically by an etching process, another conductor, such as unrelated gate in the vicinity where the strap is to be contacted to the moat, may be inadvertently exposed. That is to say, if the insulating layer over the unrelated gate is completely etched away prior to forming the strap, the unrelated gate may be disadvantageously shorted to the first gate when the strap is formed.

Conventionally this problem is treated by keeping unrelated gates at least one registration tolerance away from the site where the strap will be formed so that no such undesirable shorting can occur. What is needed is a method which will accommodate the etching requirements for formation of the strap yet allow the unrelated gate to be moved closer to the area where the strap will be formed, so that real estate may be saved.

SUMMARY OF THE INVENTION

The problems outlined above are in large measure solved by the method in accordance with the present invention. That is to say, the method hereof provides a process for removing selected portions of a relatively thick insulating layer where a contact is to be formed while at the same time allowing an unrelated conductor to be sited in very close proximity therewith. The method in accordance with the present invention includes forming a first insulating layer on a substrate and then forming a first conductive layer over the first insulating layer. A second insulating layer is then formed on top of the first conductive layer. The second insulating layer is then patterned to expose a selected area of the first conductive layer, denominated the conductor contact area.

In this fashion a step is created in the second insulating layer so that the original thickness of the second insulating layer is reduced in those portions over the conductor contact area. Other portions of the second insulating layer and the first conducting layer are selectively removed to expose an area of the substrate denominated the moat contact area. Also during this step, other portions of the first conductive layer may be se-

2 lectively removed to define an unrelated conductor. A third insulating layer is then added to the resultant structure. Subsequently, the third insulating layer is selectively removed from the conductor contact area of the first conductive layer and moat contact area.

According to the invention, the etching requirements for removing the insulation over the conductor contact area (i.e. the third insulating layer and the reduced thickness of the stepped portion of the second insulating layer) are less than for the insulation over the unrelated conductor (i.e. the third insulating layer and the original thickness of the second insulating layer). Since the insulation overlying the unrelated conductor is thicker, the possibility of exposing the unrelated conductor during the step of exposing the conductor contact area is eliminated. A second conductive layer is then formed and patterned to define a strap between the moat contact region and the conductor contact region. In this fashion it will be seen that the strap can be formed in close proximity to and overlie the unrelated conductor with minimal risk of shorting the unrelated conductor with the strap formed.

BRIEF DESCRIPTION OF THE DRAWINGS

FIGS. 4A-F are progressive sectional views of a processing sequence in accordance with the invention;

DESCRIPTION OF THE PREFERRED EMBODIMENT

Figure 2A:
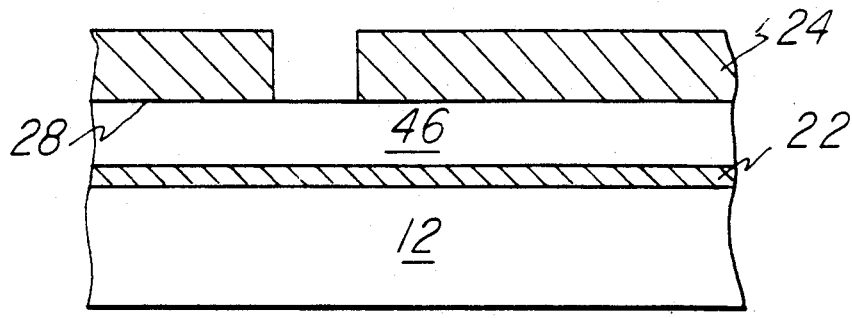
FIGS. 2A-D are progressive sectional views of a processing sequence in accordance with the present invention.
Figure 2B:
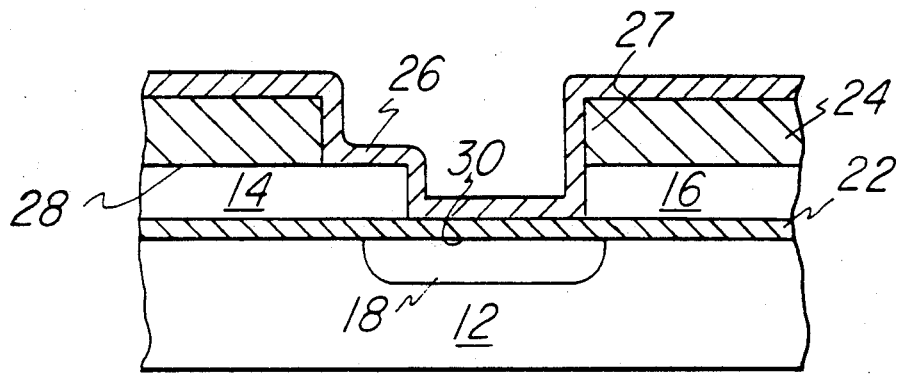
Figure 2C:
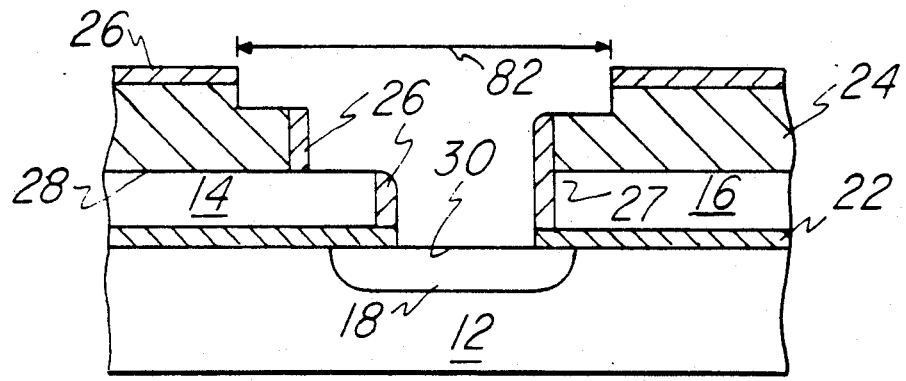
Figure 2D:
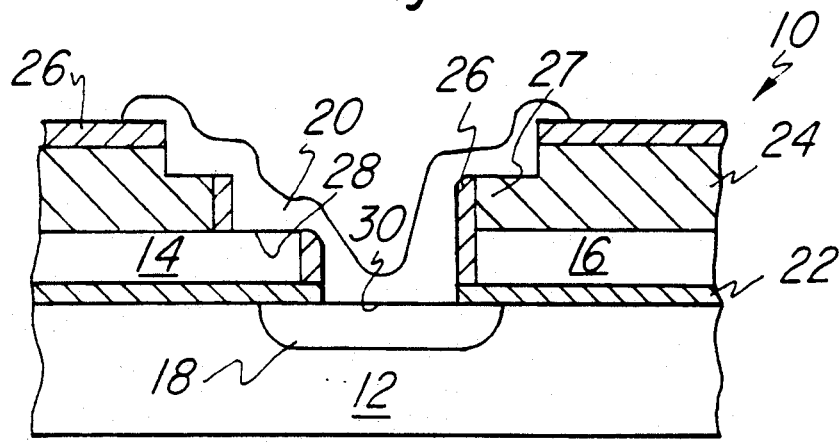

Referring now to the drawings in general, and FIG. 2D in particular, an integrated-circuit device 10 incorporating the inventive concept is partially depicted in cross section. It will be readily understood by those skilled in the art that the device 10, partially depicted in FIG. 2D, is a complete integrated circuit and that only a small portion thereof is depicted for ease in illustrating the inventive concept.

Device 10 features a substrate 12, a first conductor or gate 14, a second conductor or gate 16, a heavily doped active region or moat 18, a strap or local interconnect 20, a first insulating layer 22, a second insulating layer 24 and a third insulating layer 26.

First conductor 14 and second conductor 16 (also referred to as "unrelated conductor") function as gates in this embodiment of the invention; strap 2 connects first conductor 14 to moat 18 by respectively, intimately contacting a conductor contact area 28 and a moat contact area 30. The conductor contact area 28 is at the interface between gate 14 and strap 20 while moat contact area 30 is at the interface between strap 20 and moat 18. Thus first gate 14 and moat 18 are in electrical communication. It will be further noted that portions of strap 20 overlie second conductor 16 generally in an overlap area 27.

Figure 1A:
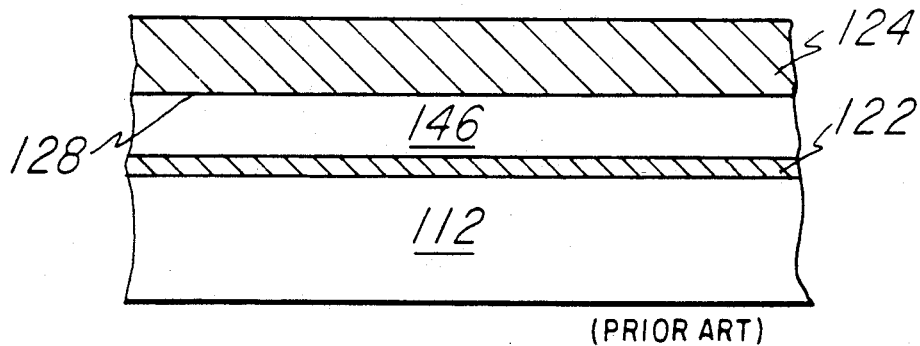
FIGS. 1A-D are progressive sectional views of a processing sequence representative of the prior art.
Figure 1B:
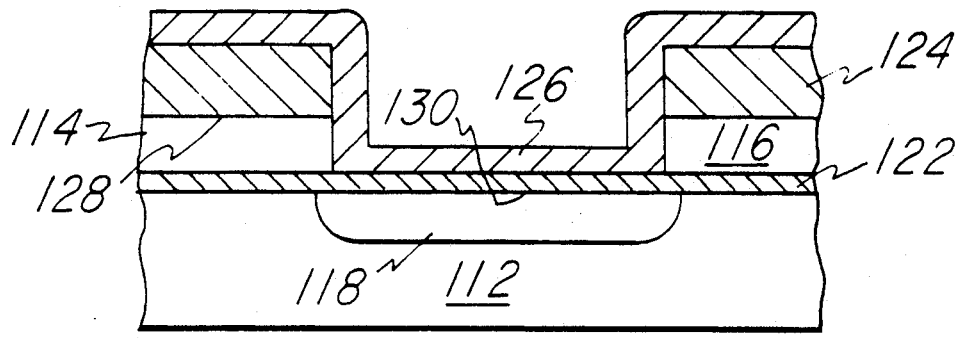
Figure 1C:
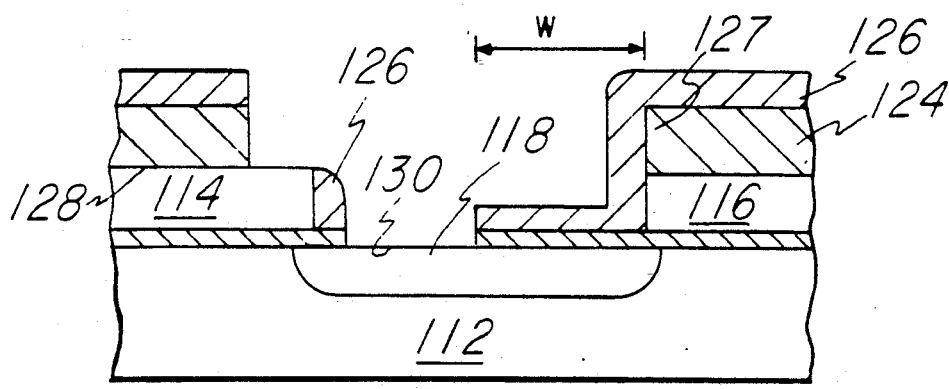
Figure 1D:
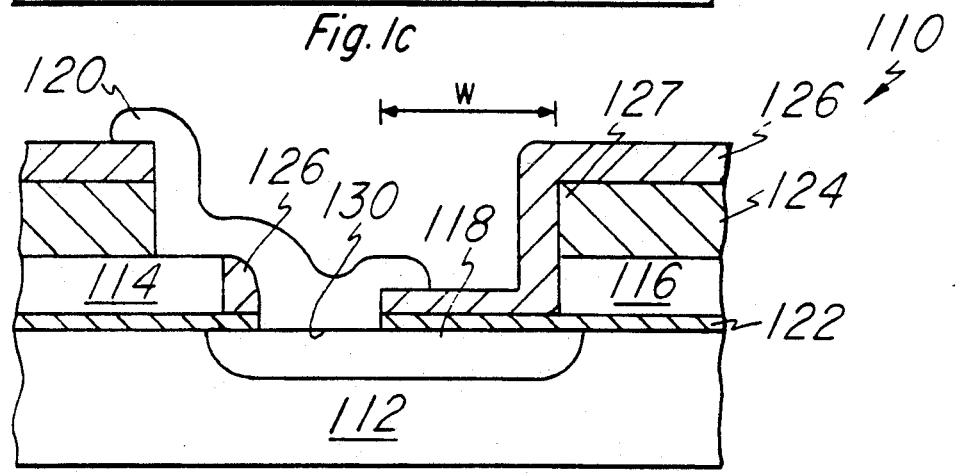

Referring now to FIG. 1D, integrated-circuit device 110, representative of the prior art, is depicted in partial cross section. Device 110 features a substrate 112, a first conductor or gate 114, a second conductor or unrelated gate 116, a heavily doped active region or moat 118, a strap or local interconnect 120, a first insulating layer 122, a second insulating layer 124 and a third insulating layer 126

First conductor 114 and second conductor 116 function as gates in this embodiment and strap 120 connects first conductor 114 to moat 118 by intimately contacting a conductor contact area 128 and a moat contact area 130. The conductor contact area 128 is at the interface between first gate 114 and strap 120 while moat contact area 130 is at the interface between strap 120 and moat 118. Thus gate 114 and moat 118 are in electrical communication. It will further be noted that portions of second insulating layer 124 and third insulating layer 126 overlie second gate 116 generally in a nonoverlap area designated by reference numeral 127.

By comparing FIGS. 1D and 2D, it will be noted that overlap area 27 and nonoverlap area 127 are different in the sense that moat contact area 130 is laterally spaced from second gate 116 while moat contact area 30 is laterally adjacent to second gate 16. In fact, with reference to FIGS. 1C and 1D, it will be noted that a certain laterally spaced distance W exists between moat contact area 130 and second gate 116.

Thus a comparison of FIG. 1D and 2D demonstrates an advantage of the present invention, specifically the saving of circuit area (i.e. "real estate") as evidenced by the additional lateral distance W required for integrated circuit device 110 of the prior art. The requirement for this lateral distance W between moat contact region 130 and second gate 116 of device 110 of the prior art arises because first gate 114 and second gate 116 are unrelated in the sense that shorting therebetween would be deleterious to the functioning of device 110. Note that strap 120 is in electrical communication with first conductor 114 at conductor contact area 128. It follows that if strap 120 were to be shorted to second conductor 116 (e.g. in the vicinity of nonoverlap are 127) first conductor 114 would be shorted to second conductor 116.

Referring now to FIGS. 2A-2D and FIG. 6, the generalized process flow for the construction of device 10 will now be discussed. It should be noted that the process flow as recited is generalized and many minor details of such steps as well as other steps altogether are omitted since such details will vary according to the intended application and such steps are also readily understood by persons having skill in the art.

Figure 6:
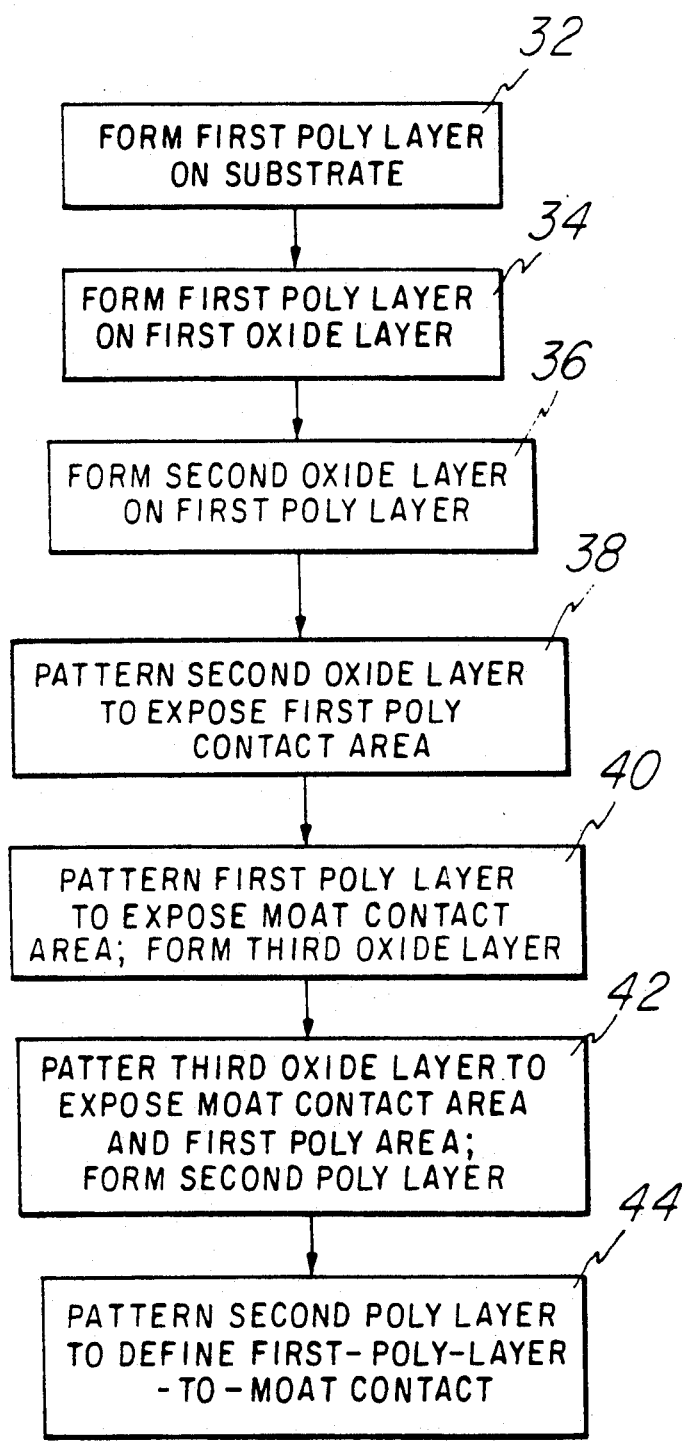
FIG. 6 is a block diagram depicting the inventive processing sequence as illustrated in FIG. 2.

Referring now to FIG. 6, the process of forming circuit device 10 is illustrated in the sequence of schematic boxes 32-44. It will be noted that FIG. 6 recites more specificity in the fabrication of device 10. For example, first insulating layer 22 is referred to as a first oxide layer. The references to more specific types of materials is to aid in the exposition of the invention and should not be interpreted as limiting the scope thereof. For example, rather than forming a second oxide layer (as recited in schematic box 36) an ONO layer could be formed as a second insulating layer.

Now with continuing reference to FIG. 6, FIG. 2A illustrates the steps performed in schematic boxes 32-38. That is to say at schematic box 32, a first insulating layer 22 is formed on substrate 12. Then in schematic box 34 a first poly layer or first conductive layer 46 is formed on first insulating layer 22. First poly layer 46 is then doped. Then at schematic box 36 second insulating layer 24 is formed on first poly layer 46. Finally in FIG. 2A, second insulating layer 24 is patterned to expose conductor contact area 28 as at schematic box 38.

Referring now to FIG. 2B, which corresponds to schematic box 40, first poly layer 46 is patterned to define first gate 14 and second gate 16. It will be noted that the patterning of first poly layer 46 to define first conductor 14 and second gate 16 also thereby exposes those portions of first insulating layer 22 overlying moat contact area 30. In the preferred method as shown, these portions of first insulating layer 22 are not completely removed at this process step. It will be noted that in order to pattern first poly layer 46 as described above, it is also necessary to further pattern second insulating layer 24, at least those portions which overlie moat contact region 30, in order to pattern first poly layer 46 thereat. However, it should be noted that the step recited in schematic box 38 of exposing conductor contact area 28 could also be utilized to simultaneously remove some portion of second insulating layer 24 overlying moat contact region 30.

Finally a third insulating layer 26 is formed as shown. The thickness of third insulating layer 26 should preferably be substantially less than that of second insulating layer 24 in accordance with the invention. For example, second insulating layer 24 could have a thickness of about 2000 angstroms and third insulating layer 26 could have a thickness of about 450 angstroms. An implant is then performed to dope moat 18.

FIG. 2C corresponds to the steps recited in schematic box 42. In particular, third layer 26 is patterned in a patterning region 82 as shown to expose moat contact area 30 and first poly contact area 28, in accordance with the present invention.

FIG. 2D corresponds to the steps performed in schematic box 44. In particular, a second poly layer is formed and patterned to define strap 20, so that strap 20 places first gate 14 and moat 18 in electrical communication as discussed above.

Figure 5:
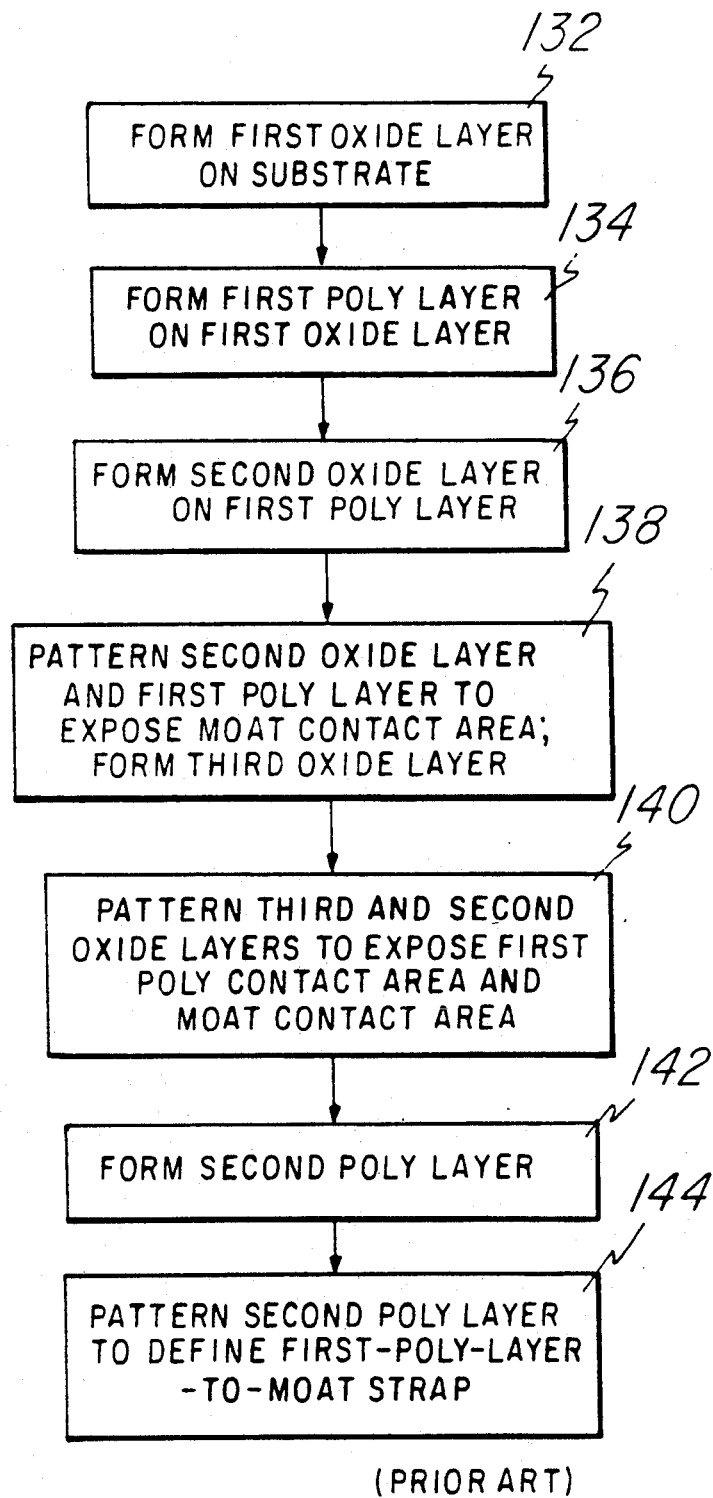
FIG. 5 is a block diagram of a representative processing sequence of the prior art as illustrated in FIGS. 1A-D.

FIG. 5 recites steps as depicted in schematic boxes 132-144 for the formation of device 110 of the prior art. The general sequence for fabricating device 110 in the context of FIG. 5 and FIGS. 1A-1D will now be discussed. As noted with the relationship of FIG. 2A-2D to FIG. 6, it will be noted that some of the terminology in FIG. 5 is more specific than that in the exposition and of FIGS. 1A-1D.

The steps shown in FIG. 1A correspond to schematic boxes 132-136. In particular, first insulating layer 122 is formed on substrate 112 as generally recited at schematic box 132. Then a first poly layer or a first conductive layer 146 is formed on first insulating layer 122 as recited in schematic box 134. First poly layer 146 is then doped. Finally a second insulating layer 124 is formed on first poly layer 146. It should be noted that no step analogous to schematic box 38 of FIG. 6 is performed in the sequence of FIGS. 1A-1D. That is to say, conductor contact area 128 is not exposed prior to the patterning conductive layer 146 to expose moat contact area 130.

FIG. 1B corresponds to schematic box 138. In particular, second insulating layer 124 is patterned, as is first poly layer 146, to define first gate 114 and second gate 116 as well as to expose moat contact area 130. Third insulating layer 126 is then formed and an implant is performed to form heavily doped moat 118.

FIG. 1C corresponds to schematic box 140. A third insulating layer 126 is formed on second insulating layer 124 and first insulating layer 122 as shown. Third insulating layer 126 and second insulating layer 124 are then patterned in order to expose conductor contact area 128 and moat contact area 130.

FIG. 1D corresponds to schematic boxes 142 and 144. As recited in schematic box 142, a second poly layer is formed and is subsequently patterned as recited in schematic box 144 to define strap 120 as shown.

The fabrication sequences recited for device 10 and device 110 will now be compared and contrasted. Referring to FIG. 2A and schematic box 38 as noted above, first gate contact region 28 is exposed by the patterning of second insulating layer 24. As was previously noted, no such exposure of conductor contact 128 is analogously performed in the fabrication of device 110 (See FIG. 1A). Thus, by comparing FIG. 2B and 1B it will be seen that conductor contact region 128 is covered by a much thicker portion of oxide than is conductor contact area 28. That is to say, conductor contact area 128 is covered both by second insulating layer 124 and third insulating layer 126 whereas conductor contact area 28 is covered only by third insulating layer 26. Hence the etching requirements for exposing conductor contact area 28, as recited in schematic box 42 and depicted in FIG. 2C, are much less than the etching requirements for exposing conductor contact area 128, such exposure recited in box 140 and shown in FIG. 1C.

Hence it will be readily appreciated that a relatively more severe etch will be performed in exposing conductor contact area 128 than in exposing conductor contact area 28. The etch performed to expose conductor contact area 128, (as recited in schematic box 140 and illustrated in FIG. 1C) means that the second gate 116 must be moved a lateral distance W (e.g. one registration tolerance) away from moat contact area 130 for the followings reasons.

Without the lateral distance W of second gate 116 from moat contact area 130 (i.e. if second gate 116 and second insulating layer 124 were laterally extended to the left a distance W) then nonoverlap area 127 might be exposed to the same etch utilized to expose conductor contact area 128. In that case second insulating layer 124 and third insulating layer 126 would be reduced in the nonoverlap area 127 to roughly the same extent as over conductor contact area 128. Thus there would be a substantial risk that second gate 116 would be exposed when conductor contact region 128 was exposed. In this manner the formation of strap 120 could result in a short between strap 120 and second gate 116 with undesirable consequences as discussed above. Hence the registration tolerance or lateral distance W is provided in device 110 so as to minimize the risk of etching area 127 during the course of the etch exposing conductor contact area 128. Thus the need for the lateral distance W between strap 120 and second gate 116 will readily be understood by those skilled in the art. Without such a distance the danger of shorting therebetween would be substantial.

In contradistinction, and according to the present invention, since the etching requirements for performing the step recited in schematic box 40 (i.e. the exposure of first contact area 28 as depicted in FIG. 2B) are much less since only third insulating layer 26 (and any remainder of second insulating layer 24, i.e. a stepped portion having a reduced thickness less than the original thickness of second insulating layer 24) is being etched for such exposure step, the danger of shorting is eliminated. In this regard note that the second insulator 24 and the third insulating layer 26 still cover second gate 16 in the overlap area 27. Thus if enough etching to expose conductor contact area 28 does occur in the region of overlap area 27, such etching will not run a substantial risk of exposing second gate 16. Since there is no risk of exposure of second gate 16, no lateral spacing W is required according to the invention. Thus strap 20 can be formed to overlap second gate 16 as shown in FIG. 2D and thus real estate in the amount of the lateral distance W is saved in forming circuit 10. It will be noted in this regard that an additional step, namely schematic box 38 of exposing conductor contact area 28 is required but as will be appreciated by those skilled in the art, such additional step is well justified by the saving of real estate. Another benefit is the enhanced yield provided by the present invention due to eliminating the possibility of shorting in forming such a configuration between strap 20 and second gate 16. It should further be noted that this technique can be used in any area of device 10 where such structures as straps, local interconnects, connects and the like are to be formed in the vicinity of unrelated conductors. That is to say, this technique of performing a prior etch can be performed in any portion of the circuit where an exposing etch would run the risk of shorting one conductor to another.

A more detailed embodiment of the present invention will now be described. In particular, and with reference to FIG. 3, a schematic circuit diagram of an integrated circuit device 210 is partially depicted including a 4T-2R SRAM cell 248 as shown. SRAM cell 248 includes n-channel pass transistor 250 (also denominated as Q1), pass transistor 252 (also denominated as Q2), n-channel drive transistor 254 (also denominated as Q3) and n-channel drive transistor 256 (also denominated as Q4). SRAM cell 248 also includes load resistor 258 (also denominated as R1) and load resistor 260 (also denominated as R2), as well as node 262 (also denominated as N1) and node 264 (also denominated as N2).

Figure 3:
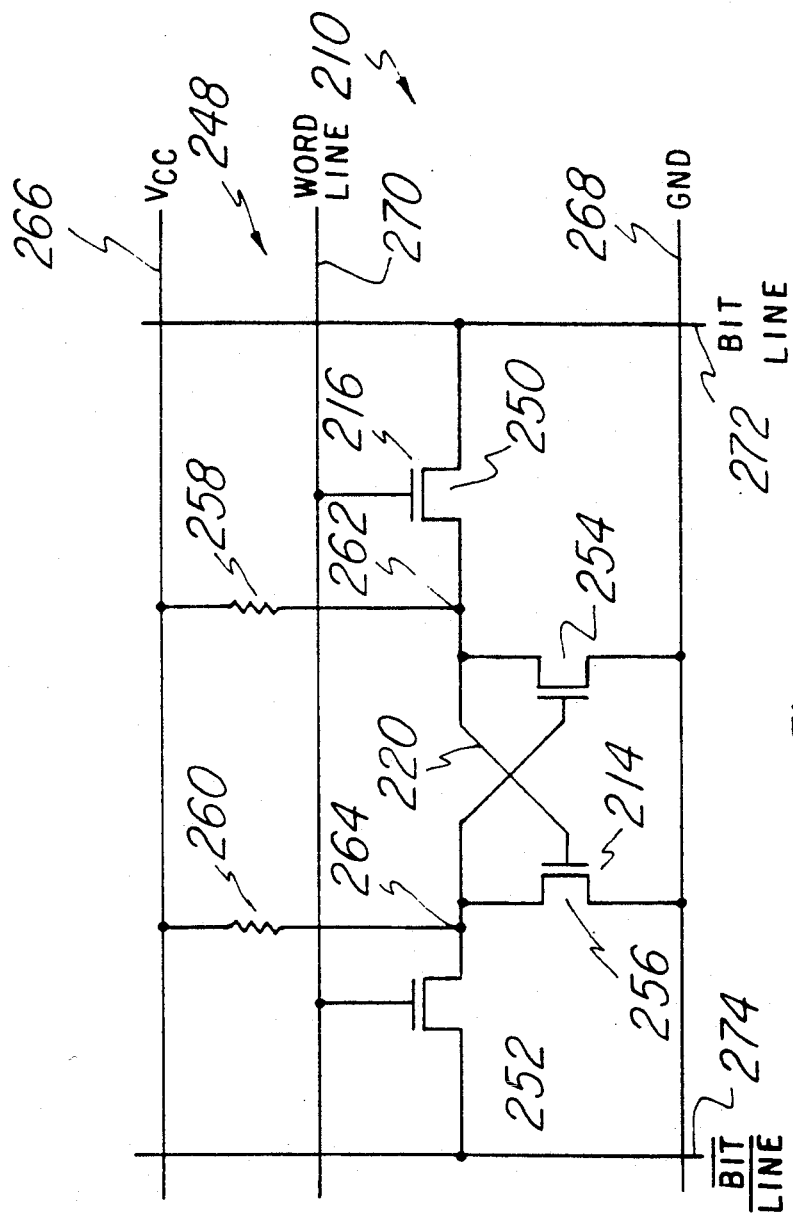
FIG. 3 is a schematic of an SRAM cell formed in accordance with the present invention.

Also shown in FIG. 3 are the high voltage line 266 (also denominated as Vcc), ground line 268 (also denominated as GND), word line 270, bit line 272 and the complementary bit line 274. Strap 220 is also shown schematically in FIG. 3.

In schematic terms, the scaling problem described with reference to spacing distance W of FIGS. 1C and 1D is analogous to the spacing problem between node 262 and gate 216 of pass transistor 250. Note that the pass transistors utilize the bilateral nature of MOS transistors by which source and drain can be interchanged.

Pass transistor 250 and drive transistor 256 have respective gates 216, 214 which are unrelated in the sense discussed above with respect to shorting with a strap. Reference to FIG. 3 indicates schematically that strap 220 connects the gate 214 of drive transistor 256 to node 262. Node 262 also serves as a source/drain for pass transistor 250 and thus the problem of scaling and saving real estate arises as discussed in the context of FIG. 1A-1D and device 110.

Referring now to FIG. 4F, a portion of integrated-circuit device 210 constructed in accordance with the present invention is shown in cross section. Device 210 utilizes an array of SRAM cells 248 such as the one depicted in FIG. 3. It will be readily understood by those skilled in the art that device 210 includes an array of such memory cells as well as other circuitry appropriate for the particular application. As in the case of the description of the process flow of device 10, the process flow for fabricating device 210 will now be described omitting details unnecessary to the invention and modifications of same being well understood in the art. N1, Q1, Q4, R1, Vcc and GND are all indicated for ease of understanding in comparison with FIG. 3.

Specific dimensions and other aspects and parameters of the design and process flow are mentioned only for illustrative purposes and may be modified for a given technical application. Hence it will readily be understood by those skilled in the art that only so many process steps are enumerated as considered relevant to give a sufficient description to one skilled in the art.

Referring now to FIG. 4A, substrate 212 is shown with a field oxide 276 of about 5000 angstroms formed therein. It will be readily understood in the following discussion that the elements depicted are not intended to be proportionately scaled but rather only drawn to give a qualitative appreciation of relative dimensions. Substrate 212 is typically formed on monocrystalline manufacturing-grade silicon but other semiconductor materials could be used, for example, gallium arsenide. First insulating layer 222 is then formed on substrate 212 to a thickness of about 100 angstroms. This step corresponds to schematic box 32 of FIG. 6. A CVD deposit of oxide is among the various techniques for forming first insulating layer 222 as is forming thermally grown oxide. Some combination of layers of insulators could also be used in the context of no only first insulating layer 222 but also all insulating layers to follow. However the preferred technique of forming first insulating layer 222 is to utilize thermal oxide.

First polysilicon layer or first conducting layer 246 is then formed above first insulating layer 222 to a thickness of about 2500 angstroms. In the preferred method a polycide layer 278 is then formed, for example by depositing a refractory metal such as titanium and then providing thermally reactive conditions so that titanium silicide is then formed to a thickness of about 1000 angstroms. This is the essence of the step recited in schematic box 34 of FIG. 6.

Prior to the polycide layer 278 being formed, first poly layer or first conductive layer 246 is doped n-type so as to enhance the conductivity of first conductive layer or poly layer 246.

After the polycide formation, second insulating layer 224 is formed. This step corresponds to schematic box 36 of FIG. 6. Second insulating layer 224 may be an oxide, for example, having a thickness of about 2000 angstroms. Second insulating layer 224 is then patterned to expose conductor contact area 228, corresponding to schematic box 38 of FIG. 6. It will also be noted with reference to FIG. 4A that some portions of second insulating layer 224 above moat contact area 230 are also removed in the same patterning step. This is done by overlapping the poly contact area 228 over moat contact area 230 by at least one registration tolerance. The purpose of such an overlap is to take care of misalignment between the gate pattern and the pattern used to expose area 228. Such an overlap will ensure that maximum conductor contact area 228 is available for forming the strap 220 at a later process step in FIG. 4E.

Referring now to FIG. 4B, first poly layer 246 is patterned to expose moat contact area 230. This step corresponds to the first step in schematic box 40 of FIG. 6. As indicated in the drawing, moat contact area 230 is not literally exposed but rather first insulating layer 222 still resides thereover. However, this is optional and the moat contact area 230 may actually be exposed at this step.

Referring now to FIG. 4D, a lightly doped drain (LDD) process is used to form the source and drain regions 218 and 219. After the gate etch, a thin layer of oxide (not shown) is thermally grown or CVD deposited and is followed by a light phosphorous implant in the source region 218 and drain region 219. Next, an oxide spacers 280, of about 1000 angstroms, are formed followed by 300 angstroms of oxide deposition and a high dose of phosphorous and/or arsenic implant in the source and drain regions 218 and 219 (it should be noted that source drain region 218 is also referred to as moat 218 or active region 218 to correspond with the terminology used with respect to FIGS. 1 and 2). N-MOS and P-MOS transistors in the periphery are also formed using the lightly doped source-drain processes.

Following the implants, a thin layer (about 150 angstroms) of silicon nitride is deposited. The 300 angstroms oxide and 150 angstroms nitride, as a composite, form the third insulator layer 226. Thus the total thickness of third insulating 226 layer is 450 angstroms and is shown in FIG. 4C as one integral layer for ease of illustration. Formation of third insulating layer 226 corresponds to the last step in schematic box 40 of FIG. 6.

Referring to FIG. 4D, third insulating layer 226 is patterned to expose conductor contact area 228 and moat contact area 230. The lateral distance over which third insulating layer 226 is patterned is depicted as contact window 282 as shown. This corresponds to the first step in schematic box 42 of FIG. 6. After the patterning etch described above, an HF deglaze is performed prior to subsequent depositions in order to remove interfacial oxides. The purpose of the 150 angstroms nitride is to prevent etching away of 300 angstroms of oxide from the heavily doped regions like 219 other than the moat contact area 230 during HF deglaze.

Referring to FIG. 4E, a second phosphorous-doped poly layer (not shown in its entirety) is formed and patterned to define local interconnect or strap 220 and a portion of ground line 268 (see also FIG. 3) as shown. The process of patterning the second poly layer to define strap 220 corresponds to schematic box 44 of FIG. 6.

Referring to FIG. 4F, a fourth insulating layer 284 is formed and patterned as shown. A third poly layer 286 is formed and patterned as shown. A portion of third poly layer 286 is masked while the remainder is heavily implanted with n-type dopant, the masked portion corresponding to load resistor 258 (see FIG. 3). Subsequently a passivating fourth insulating layer 288 is formed and planarized. Fourth insulating layer 288 can be any suitable passivating material such as an oxide or silica. After fourth insulating layer 288 is planarized, a contact etch is performed followed by the deposition of a metal or alloy such as tungsten. A titanium tungsten barrier can be formed between interconnect 287 and bit line 272

Referring once again to FIG. 4D, after third insulating layer 226 is patterned to expose conductor contact area 228 and moat contact area 230 in the contact window 282, the oxide that is etched is equal to the third insulating layer thickness plus some overetch, typically about 20-50% of third insulating layer. This overetch will etch field oxide 276 and reduce the field isolation width by altering the field oxide 276/moat 218 edge. This can result in increased junction and field leakage currents and thus is detrimental to the functioning of the device. One advantage of the invention in reducing these effects is apparent because with respect to the prior art it would be necessary to etch oxide thickness corresponding to second insulating layer 224 plus third insulating layer 226. For a given percentage overetch more field oxide 276 would be lost, hence reducing field isolation width.

According to the invention, contact window 282 overlies gate or second conductor 216 and the corresponding insulation of overlap area 227. Referring back to FIGS. 4B and 4C, it will be readily understood that if the conductor contact area 228 had not been exposed prior to gate patterning the etching requirements to expose conductor contact area 228 would have been much greater, thereby risking the possibility of shorting strap 220 to gate 216. In view of the fact that the etching requirements to expose conductor contact area 228 lessened, a less severe etch is performed so that gate 216 may, in fact, be placed adjacent to moat contact area 230 in accordance with the invention.

The invention is described for an n-type first poly layer 246, an n-type second poly layer and an n-type moat 218, but it could be utilized for a p-type first poly, second poly and moat, or any combination of n-type or p-type first poly, second poly and moat. Moreover, some or all of the three layers first poly, second poly and moat could be silicided. Indeed, any other conductor, such as a metal could be substituted for polysilicon.

Although the invention has been described in detail herein with reference to its preferred embodiment and certain described alternatives, it is to be understood that this description is by way of example only, and is not to be construed in a limiting sense. It is to be further understood that numerous details of the embodiments of the invention, and additional embodiments of the invention, will be apparent to, and be made by persons of ordinary skill in the art having reference to this description. It is contemplated that all such changes and additional embodiments are within the spirit and true scope of the invention as claimed below.

What is claimed is:

1. A method of forming an integrated-circuit device, the method comprising:
   (a) providing a substrate;
   (b) providing a first conductor adjacent said substrate, said first conductor having a conductor contact region;
   (c) forming a first-conductor insulator over at least a portion of said first conductor, including said conductor contact area of said first conductor, said first-conductor insulator presenting an original thickness;
   (d) removing selected portions of said first-conductor insulator so that said first-conductor insulator includes a stepped portion at least over said conductor contact region, said stepped portion of said first-conductor insulator presenting a reduced thickness, substantially less than said original thickness;
   (e) providing a second conductor adjacent said substrate, said second conductor laterally spaced from said first conductor;
   (f) providing a second-conductor insulator over said second conductor, said second-conductor insulator presenting a thickness substantially greater than said reduced thickness of said first-conductor insulator;
   (g) exposing said conductor contact region without exposing said second conductor; and
   (h) providing a third conductor in intimate contact with said first conductor at said conductor contact region whereby said third conductor is proximal said second conductor yet said first conductor is not electrically shorted to said second conductor.

2. The method of claim 1, wherein a first insulating layer is formed on said substrate between steps (a) and (b);

3. The method of claim 2, wherein step (c) further comprises forming a second insulating layer over said first conductor, including said conductor contact area of said first conductor, and over said second conductor, said second insulating layer presenting an original thickness.

4. The method of claim 3, wherein step (f) further comprises forming a third insulating layer over said first conductor, including said conductor contact area of said first conductor, and over said second conductor, so that said second-conductor insulator presents a thickness substantially greater than said reduced thickness of said first-conductor insulator.

5. The method of claim 4 wherein said thickness of said third insulating layer is substantially less than said original thickness of said first-conductor insulator.

6. The method of claim 1, further comprising:
   providing an active region in said substrate, said active region proximal to said first conductor, upper portions of said active region presenting a moat contact area.

7. The method of claim 6, wherein at step (d) said stepped portion is further disposed over at least some portions of said moat contact area.

8. A method of forming an integrated-circuit device, the method comprising:
   (a) providing a substrate;
   (b) providing a first conductor adjacent said substrate, said first conductor having a conductor contact region;
   (c) forming a first-conductor insulator over at least a portion of said first conductor, including said conductor contact area of said first conductor, said first-conductor insulator presenting an original thickness;
   (d) removing selected portions of said first-conductor insulator so that said first-conductor insulator includes a stepped portion at least over said conductor contact region, said stepped portion of said first-conductor insulator presenting a reduced thickness, substantially less than said original thickness;
   (e) providing an active region in said substrate, said active region proximal to said first conductor, upper portions of said active region presenting a moat contact area;
   (f) providing a second conductor adjacent said substrate, said second conductor proximal said active region and laterally spaced from said first conductor;
   (g) providing a second-conductor insulator, said second-conductor insulator presenting a thickness substantially greater than said reduced thickness of said first-conductor insulator;

(h) exposing said conductor contact region and said moat contact area without exposing said second conductor; and (i) providing a third conductor in intimate contact with said first conductor at said conductor contact region and said active region at said moat contact area whereby said third conductor is not electrically shorted to said second conductor.

9. A method of forming an integrated-circuit device, the method comprising:

(a) providing a substrate;

(b) forming a first insulating layer on said substrate;

(c) providing a first conductive layer on said first insulating layer, said first conductive layer having a conductor contact area;

(c) forming a second insulative layer over at least a portion of said first conductive layer, including said conductor contact area of said first conductive layer, said second insulating layer presenting an original thickness;

(d) removing selected portions of said second insulative layer so that said second insulative layer includes a stepped portion at least over said conductor contact region, said stepped portion of said second insulative layer presenting a reduced thickness, substantially less than said original thickness;

(e) removing selected portions of said first conductive layer to define a first gate formed from portions of said first conductive layer, said first gate including said conductor contact region;

(f) forming a third insulating layer, including over said conductor contact region;

(g) removing portions of said third insulating layer over said conductor contact region and said stepped portion of said second insulating layer over said conductor contact region;

(h) forming a second conductive layer in intimate contact with said first conductive layer at said conductor contact region.

10. The method of claim 9 wherein said first conductive layer is formed of polysilicon.

11. The method of claim 10 wherein said first conductive layer is doped with n-type dopant.

12. The method of claim 9 wherein said original thickness of said second insulating layer is about 2000 angstroms and said third insulating layer presents a thickness of about 450 angstroms.

* * * * *